(12) United States Patent
Furman et al.

(10) Patent No.: US 7,898,076 B2
(45) Date of Patent: Mar. 1, 2011

(54) STRUCTURE AND METHODS OF PROCESSING FOR SOLDER THERMAL INTERFACE MATERIALS FOR CHIP COOLING

(75) Inventors: Bruce Furman, Poughquag, NY (US); Madhusudan K. Iyengar, Woodstock, NY (US); Paul A. Lauro, Brewster, NY (US); Yves Martin, Ossining, NY (US); Roger R. Schmidt, Poughkeepsie, NY (US); Da-Yuan Shih, Poughkeepsie, NY (US); Theodore G. Van Kessel, Dutchess County, NY (US); Wei Zou, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 679 days.

(21) Appl. No.: 11/742,161

(22) Filed: Apr. 30, 2007

(65) Prior Publication Data

US 2008/0265404 A1    Oct. 30, 2008

(51) Int. Cl.
*H01L 23/10* (2006.01)
(52) U.S. Cl. .................. 257/706; 257/707; 257/718; 257/719; 257/E33.075; 257/E23.051; 438/122; 228/178; 228/179.1; 228/222; 228/227

(58) Field of Classification Search .............. 257/276, 257/625, 675, 706, 707, 712–722, 796, E33.075, 257/E31.131, E23.051, E23.08–E23.113; 228/178, 179.1, 222, 227; 438/122, FOR. 413; 361/697, 702, 703, 709, 710
See application file for complete search history.

(56) References Cited

U.S. PATENT DOCUMENTS

| | | | | |
|---|---|---|---|---|
| 4,123,293 | A * | 10/1978 | Okikawa et al. | 228/123.1 |
| 7,180,179 | B2 * | 2/2007 | Mok et al. | 257/714 |
| 7,311,967 | B2 * | 12/2007 | Dani et al. | 428/323 |
| 7,364,063 | B2 * | 4/2008 | Schaenzer et al. | 228/179.1 |
| 2006/0261467 | A1 * | 11/2006 | Colgan et al. | 257/707 |

* cited by examiner

*Primary Examiner*—Jasmine J Clark
(74) *Attorney, Agent, or Firm*—Connolly Bove Lodge & Hutz LLP; Daniel P. Morris

(57) ABSTRACT

Assemblies for dissipating heat from integrated circuits and circuit chips are disclosed. The assemblies include a low melt solder as a thermal interface material (TIM) for the transfer of heat from a chip to a heat sink (HS), wherein the low melt solder has a melting point below the maximum operating temperature of the chip. Methods for making the assemblies are also disclosed.

16 Claims, 3 Drawing Sheets

STRUCTURE AND METHODS OF PROCESSING FOR SOLDER THERMAL INTERFACE MATERIALS FOR CHIP COOLING

FIELD OF THE INVENTION

The present invention relates to structures that provide heat dissipation for chip cooling using low melting temperature solders. The present invention further relates to methods of processing such structures.

BACKGROUND OF THE INVENTION

Integrated circuits (IC) device and circuit chips generate heat during operation. If a sufficient quantity of such heat is not transferred away, the functional integrity of an integrated circuit or circuit chip can be compromised.

One method of removing heat from integrated circuit chips involves conducting heat away from microprocessor chips to a heat exchanger, or heat sink (HS), via a thermal interface material. The HS, which is usually located above the chip circuitry to be cooled, is thermally coupled to the chip circuitry by means of at least one thermal interface material (TIM). For example U.S. Pat. Nos. 6,724,078 and 6,504,723 each disclose using an indium solder, having a melting temperature of 157° C., as a TIM material. However, the structures and processes disclosed in those patents require metallization on both the back of the chip as well as on the Cu lid or heat sink. Such metallization creates additional manufacturing cost and complexity.

SUMMARY OF THE INVENTION

The present invention provides an assembly including at least one heat sink, at least one chip, and at least one low melt solder positioned between the chip and the heat sink, wherein the low melt solder has a melting point that is below the maximum operating temperature of the chip. In addition, the present invention provides a method for making an assembly for chip cooling which method includes providing at least one heat sink, providing at least one chip, providing a solder wetting area on the heat sink, providing at least one low melt solder on the solder wetting area, wherein the low melt solder has a melting point that is below the maximum operating temperature of the chip, placing the chip in thermal contact with the low melt solder to form the assembly, and heating the assembly to melt the low melt solder.

DETAILED DESCRIPTION OF THE INVENTION

The present invention, in at least one embodiment, provides an assembly having a low melting temperature solder ("low melt solder"), which is used as a thermal interface material (TIM) to transfer heat from an integrated circuit chip to a heat sink (HS), such as a Cu lid. The low melt solder has a melting temperature that is lower than the maximum operating temperature of the chip.

As used herein, the term "chip" can encompass any type of integrated circuitry, and includes, for example, a die that is sawed or cut from a semiconductor wafer.

As used herein, the term "heat sink" refers to any thermally conductive material or device used to transfer heat from integrated circuitry. An example of a heat sink is a copper lid (Cu lid) that is positioned above the chip circuitry to be cooled. The geometric configuration of the heat sink is not limited and can include, for example, a configuration having fins or heat pipes. The heat sink may further have liquid/vapor heat/mass transfer capability, such as a heat sink having a vapor chamber.

The heat sink should include a contact or wetting area at its interface with the low melt solder. The solder wetting capability of the heat sink may be enhanced by metallizing or flashing on the heat sink at least one material such as chromium (Cr), nickel (Ni) or gold (Au) and alloys or mixtures of the same. The low melt solder is wetted by the Au layer and will form a thin layer with the Ni layer below. The thickness of this layer is typically very thin (for example, about 10 to about 100 nm) if samples are processed at low temperature (such as less than about 100° C.) but can increase significantly (for example about 100 to about 1000 nm) at higher temperatures (such as greater than about 150° C.).

As used herein, the term "maximum operating temperature of the chip" refers to the maximum temperature at which a chip, such as an integrated circuit chip, can operate while still maintaining its functional integrity. While this parameter will vary depending on the type of chip or chip application, for many applications this temperature should not exceed about 125° C., and can often be expected to fall within the range of about 65° C. to about 85° C.

The low melt solder should have a melting point or range that is below the maximum operating temperature of the chip. Examples of suitable low mold solder materials include alloys such as InBi and InSnBi having liquid temperatures ranging from about 60° C. to about 72° C. For example an alloy containing In 66 wt % Bi 34 wt. % has a melting point of about 60° C. and an alloy containing In 51 wt %, Sn 16.5 wt % and Bi 32.5 wt % has a melting point of about 72° C.

Figure 3:
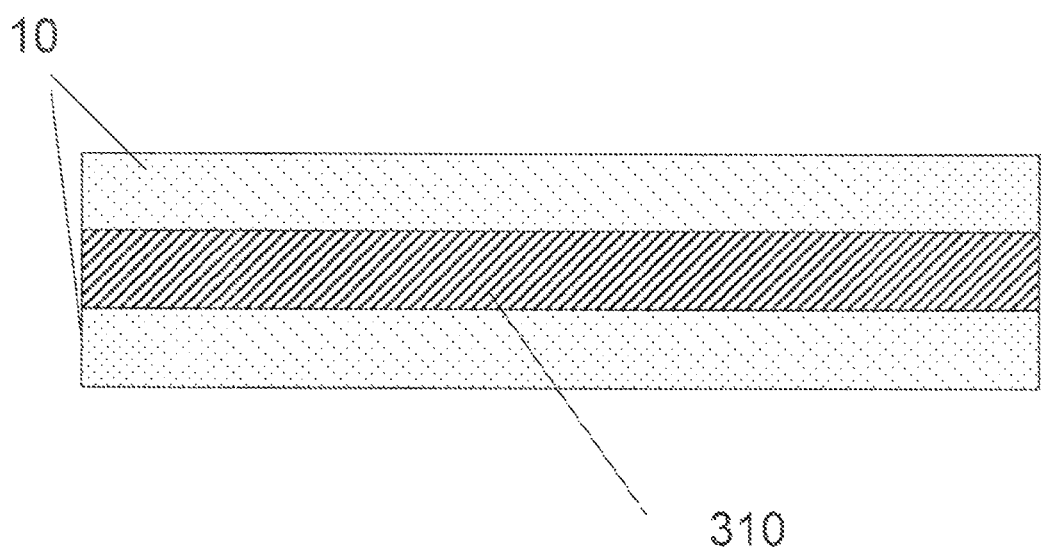
FIG. 3 is a solder perform wherein a layer of indium (In) is sandwiched between two lavers of low melt solder.

Sandwiched solder preforms can also be used. An example of a sandwiched solder preform is a layer of indium (In) 310 sandwiched between two lavers of low melt solder 10, as shown in FIG. 3.

The low melt solder may be attached or joined to the heat sink at temperatures well below its melting point or melting range. In at least one embodiment, the low melt solder may be attached or joined to the heat sink at ambient room temperature.

The low melt solder can then be placed in thermal contact with a chip. For example, the low melt solder can be in direct physical contact with the back of a chip (i.e., without the need of metallization on the back of the chip). The area of the low melt solder closest to the chip should preferably be greater than the area of the back of the chip such that the periphery of the low melt solder extends beyond the periphery of the chip. The extent should preferably not approach any surrounding components and in some cases a seal can be provided prevent excess low melt solder from being released to other areas. This seal can also provide a moisture barrier for some applications. This allows the solder to not only achieve thermal contact with the back of the chip but to also warp around the periphery of the chip upon melting to increase the thermal contact area between the low melt solder and the chip. In this regard, the solder can be melted with or without being metallurgically joined to the back of the chip and/or the heat sink. The joining temperature may, for example, be generally less than about 125° C. A suitable joining temperature can be a function of die operating temperature and/or the type of thermal spreader used. In this regard, lower temperature may allow additional advantages for vapor chambers that contain water.

The dimensions of the low melt solder will, of course, vary depending on the type of application for which it is employed. In general, the low melt solder should cover the entire die area and provide adequate thickness to accommodate any surface roughness or non planarities in the die to lid interface. The thickness can, for example, range from about 100 nm to about 1,000 µm depending on surface planarity, application and thermal requirements.

Various aspects falling within the scope of the invention will now be further described with reference to the figures.

Figure 1:
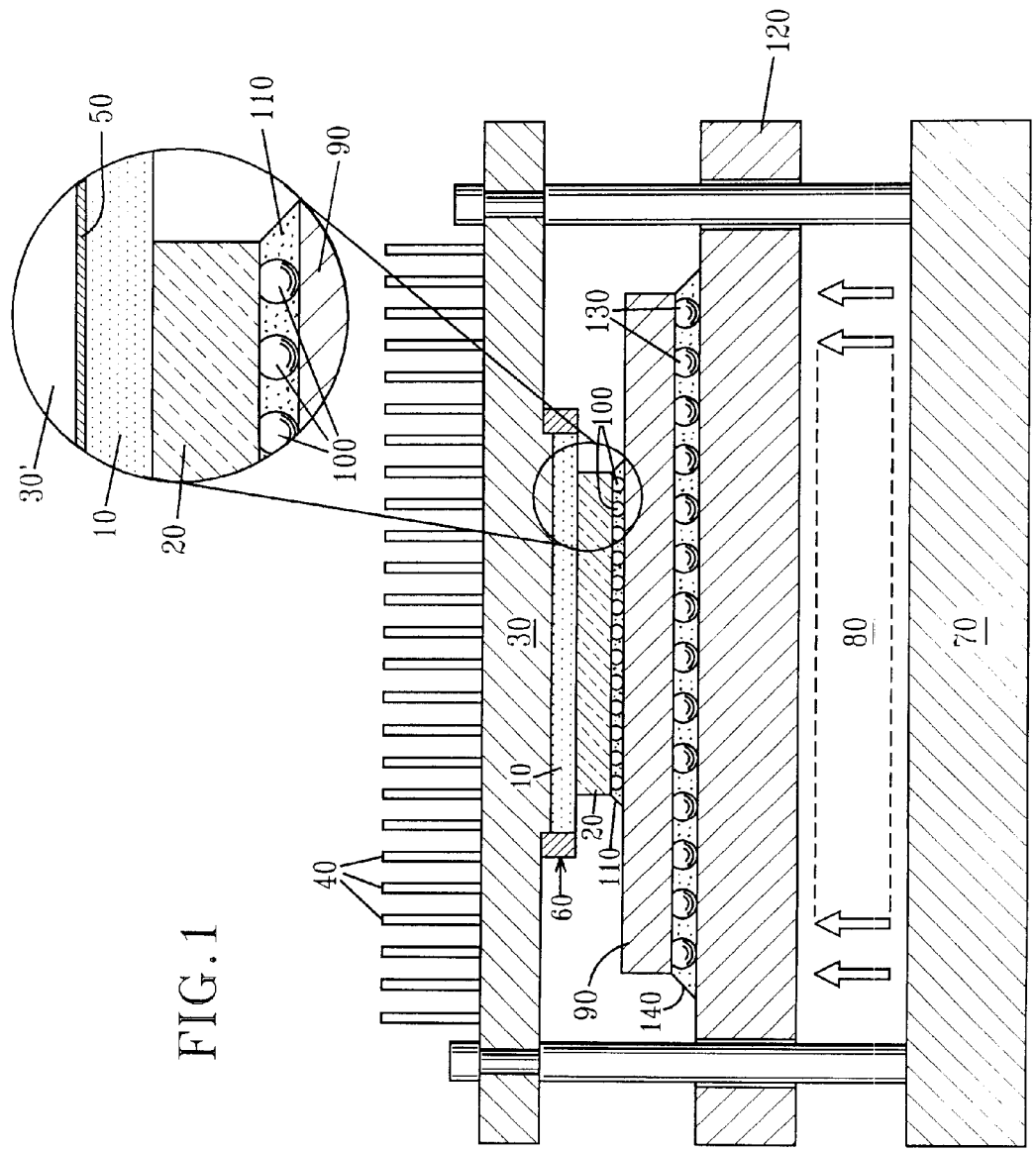
FIG. 1 is an illustrative representation of a side view of an assembly having a low melting temperature solder ("low melt solder"), wherein the low melt solder is in physical contact with the back of a chip prior to heating the assembly to melt the solder.

FIG. 1 illustrates a side view of an assembly having a low melt solder 10 wherein the low melt solder is in physical contact with the back of a chip 20 prior to heating the assembly to melt the solder. Above the low melt solder is a heat sink 30 that includes a plurality of fins or heat pipes 40. The heat sink can further include a vapor chamber (not shown). The wetability of the low melt solder to the heat sink can be enhanced by metallizing or flashing a layer 50 of material such as chromium (Cr), nickel (Ni) or gold (Au) (and alloys or mixtures of the same) to the heat sink prior to joining/attaching the low melt solder to the heat sink. For example, in one embodiment at least the portion of the heat sink to be joined to the low melt solder (i.e., wetting area) is metallized with nickel and flashed with gold. The heat sink is then joined with the low melt solder, preferably at a temperature below about 100° C., such as at ambient room temperature.

The low melt solder is contained in a frame 60 and the area of its surface closest to the chip is greater than the area of the back of the chip. The low melt solder is brought into physical contact with the back of a chip by anchoring the heat sink (now joined with the low melt solder) to a frame (or card chassis) 70 and a loading force 80 biases the back of the chip against the low melt solder.

The assembly illustrated in FIG. 1 further includes a module 90, such as an organic land grid array (OLGA) substrate, as well as solder bumps 100 and a suitable underfill 110 between the module and the chip. In addition, the assembly includes an additional substrate 120, such as printed circuit board (PCB) or card, with solder bumps 130 and a suitable underfill between the module and additional substrate.

The assembly illustrated in FIG. 1 can then be heated to melt the solder, thereby allowing the solder to warp around the periphery of the chip.

At least one embodiment falling within the scope of the present invention may overcome at least one deficiency associated with the prior art. For example, the invention may be practiced without metallization on the back of a chip, which can result in easier and less expensive manufacture. In addition, because solder is only joined or attached to the heat sink, it may exhibit improved properties as a thermal interface material in handling CTE mismatches (i.e., mismatches in coefficient of thermal expansion) during thermal processing and cycling as compared to thermal interface materials that are joined both to a heat sink and metallization on the back of a chip (i.e., "two-sided solder joints"). In addition, in comparison to two-sided solder joints, the presence of voids may be minimized or potentially eliminated. Moreover, the low melt solder can be a liquid during chip operation and thermal stability testing, which can allow greater conformity in view of the potential of chip warpage and other non-planarity issues (as compared to solder joints that remain solid during chip operation). In this regard, low melt solder after first melting can fill in air gaps and voids and make intimate contact with the chip surface.

Figure 2:
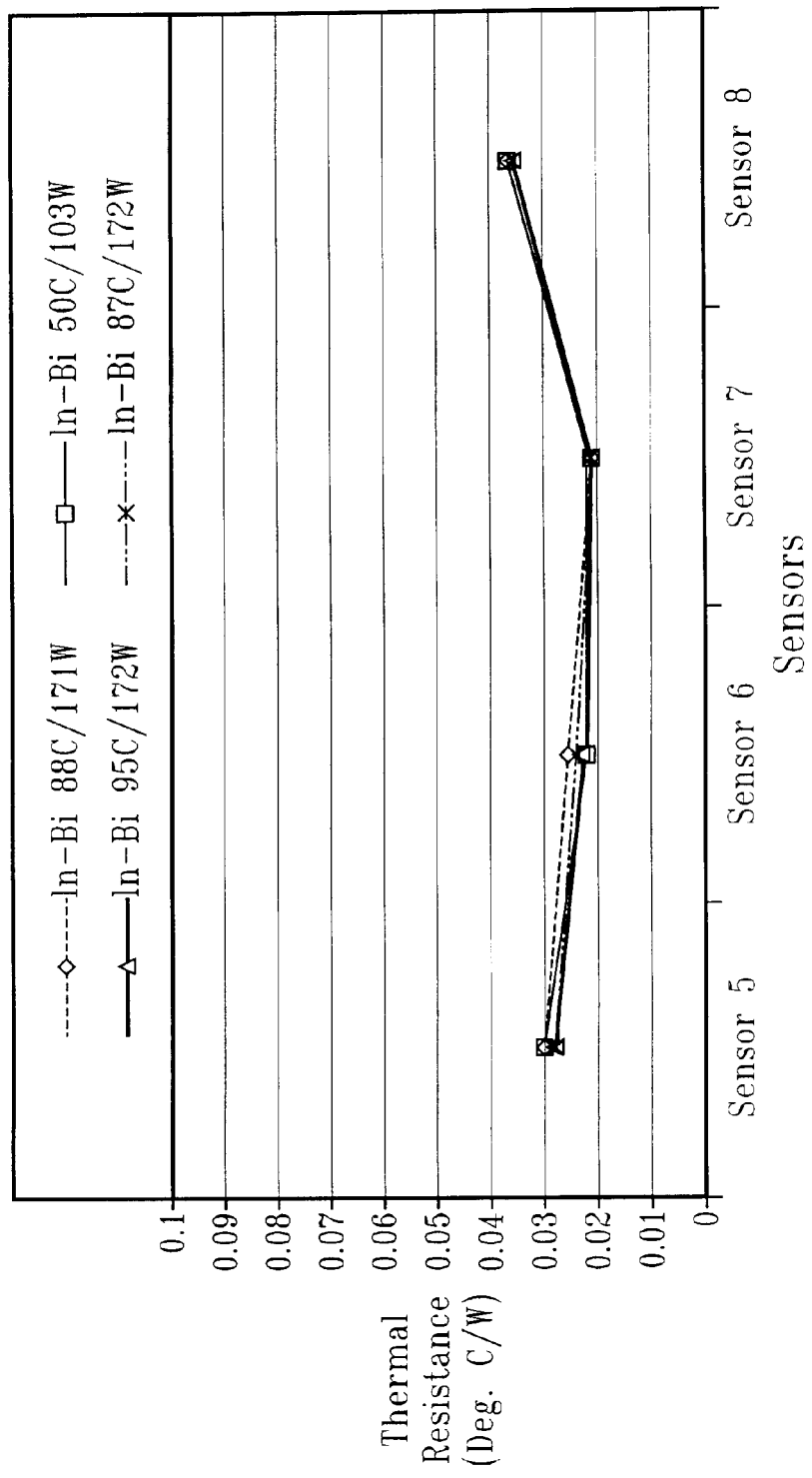
FIG. 2 is a chart showing the measured thermal resistance of an InBi low melt solder used as a thermal interface between a chip and a Cu lid.

FIG. 2 shows the measured thermal resistance of an InBi low melt solder used as a thermal interface between a chip and a Cu lid. As can be seen from the figure, in temperatures ranging from 50° C. to 95° C., the thermal resistance of the low melt solder thermal interface was never measured to be higher than about 0.04° C/W and generally ranged from about 0.02° C/W to about 0.035° C/W. The test structure includes a CMOS device having dimensions of about 18 mm per side. Nine (9) thermal sensors are spread over the device. The nine sensors include one center (sensor 9), four corners sensors (sensors 1-4) and four mid-diagonal sensors (5-8) located half way between the corner and the center of the die.

Numerous experiments with several In alloys, pure Indium, and mixed multilayer composites have been tested on both ceramic and organic laminate test structures. In addition, samples have been tested with silicon to silicon thermal sensors as well. Samples can be generally prepared by placing the solder between the heat source and spreader and applying either a compressive force and heat, heat alone of just force in such a manor to wet both surfaces to be joined with minimal air entrapment. In some cases a surrounding barrier can be used to contain the solder material or provide an environmental barrier.

While the present invention has been described in an illustrative manner, it should be understood that the terminology used is intended to be in a nature of words or description rather than of limitation. Furthermore, while the present invention has been described in terms of several illustrative embodiments, it is to be appreciated that those skilled in the art will readily apply these teachings to other possible variations of the inventions.

What is claimed as new and desired to be protected by Letters Patent of the United States is:

1. An assembly comprising:
   at least one heat sink;
   at least one chip;
   and at least two layers of low melt solder positioned between the chip and the heat sink, wherein the low melt solder has a melting point that is below the maximum operating temperature of the chip, and
   wherein the assembly further comprises at least one layer of indium (In) sandwiched between the at least two layers of low melt solder.

2. The assembly of claim 1, wherein the low melt solder has a melting point that is no greater than about 72° C.

3. The assembly of claim 1, wherein the low melt solder has a melting point ranging from about 60° C. to about 72° C.

4. The assembly of claim 1 wherein the low melt solder comprises a material selected from the group consisting of InBi and InSnBi.

5. The assembly of claim 1, wherein the heat sink comprises copper (Cu).

6. The assembly of claim 5, wherein the heat sink further comprises at least one additional material selected from the group consisting of chromium (Cr), nickel (Ni) and gold (Au) and alloys and mixtures of the same.

7. The assembly of claim 1, wherein the heat sink comprises a vapor chamber.

8. The assembly of claim 1, wherein the periphery of the low melt solder extends beyond the periphery of the chip.

9. A method for making an assembly for chip cooling comprising:
- providing at least one heat sink;
- providing at least one chip;
- providing a solder wetting area on the heat sink;
- providing at least two layers of low melt solder on the solder wetting area, wherein the low melt solder has a melting point that is below the maximum operating temperature of the chip;
- placing the chip in thermal contact with the low melt solder to form the assembly; and
- heating the assembly to melt the low melt solder,
- wherein the assembly further comprises at least one layer of indium (In) sandwiched between the at least two layers of low melt solder.

10. The method of claim 9, wherein the low melt solder has a melting point that is no greater than about 72° C.

11. The method of claim 9, wherein the low melt solder has a melting point ranging from about 60° C. to about 72° C.

12. The method of claim 9, wherein the low melt solder comprises a material selected from the group consisting of InBi, and InSnBi.

13. The method of claim 9, wherein the heat sink comprises copper (Cu).

14. The method of claim 13, wherein the heat sink further comprises at least one additional material selected from the group consisting of chromium (Cr), nickel (Ni) and gold (Au) and alloys and mixtures of the same.

15. The method of claim 9, wherein the heat sink comprises a vapor chamber.

16. The method of claim 9, wherein the periphery of the low melt soldier extends beyond the periphery of the chip.

* * * * *